United States Patent [19]

Mori et al.

[11] Patent Number: 5,589,234
[45] Date of Patent: Dec. 31, 1996

[54] METHOD OF MANUFACTURING ULTRAFINE PARTICLES OF A COMPOUND

[75] Inventors: Hirotaro Mori, Suita; Hidehiro Yasuda, Toyonaka, both of Japan

[73] Assignee: Osaka University, Osaka-Fu, Japan

[21] Appl. No.: 173,113

[22] Filed: Dec. 27, 1993

[30] Foreign Application Priority Data

Jun. 23, 1993 [JP] Japan ................................ 5-174650

[51] Int. Cl.$^6$ .......................... B05D 3/06; C23C 16/00
[52] U.S. Cl. .................... 427/597; 427/531; 427/523; 427/250; 427/255.7; 204/192.15
[58] Field of Search .................. 427/597, 531, 427/523, 255.7, 250; 204/192.15

[56] References Cited

U.S. PATENT DOCUMENTS

| | | | |
|---|---|---|---|
| 4,152,478 | 5/1979 | Takagi | 427/531 |
| 4,944,961 | 7/1990 | Lu et al. | 427/531 |

OTHER PUBLICATIONS

Mori et al, "Formation of gold–antimony (AuSb2)compound clusters by spontaneous alloying", Intermetallics, 1(1) 1993 pp. 35–40.

Yasuda et al, "Spontaneous alloying of copper atoms into gold clusters at reduced temperatures", J. Appl. Phys. 73(3) 1993 pp. 1100–1103.

Yasuda et al, "Spontaneous alloying of zinc atoms into gold clusters and formation of compound clusters," Phys. Rev. lett., 69(26) 1992 pp. 3747–3750.

*Primary Examiner*—Roy V. King
*Attorney, Agent, or Firm*—Spencer, Frank & Schneider

[57] ABSTRACT

A method of manufacturing ultrafine particles of a compound composed of at least two elements on the surface of a substrate made of at least one material selected from the group including an organic material and an inorganic material, the method including: depositing a first element onto a surface of the substrate to provide a layer of particles of the first element; depositing successively at least one additional element onto the layer of the first element on the surface of the substrate to provide respective layers of particles of the at least one additional element, the successive depositions taking place at respective deposition rate ranges which are effective for forming a compound by spontaneously alloying the first element and the at least one additional element over a time period effective to provide a preselected area density; and reacting the layers of particles on the substrate at a reaction temperature ranging from below 32° C. to −173° C., and under a vacuum ranging from $10^{-11}$ to $10^{-1}$ Torr to spontaneously alloy the first element and the at least one additional element.

5 Claims, 14 Drawing Sheets

FIG_2
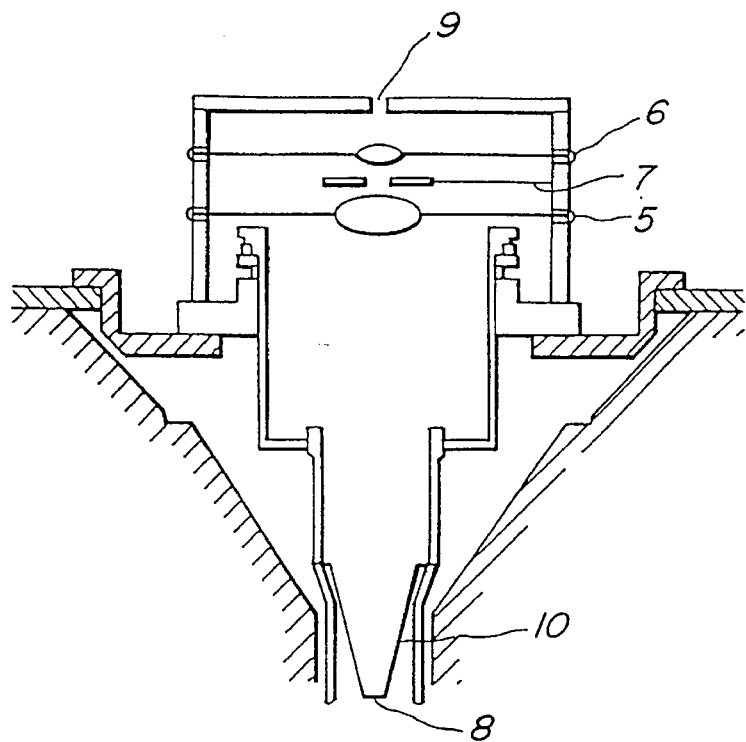
FIG_3
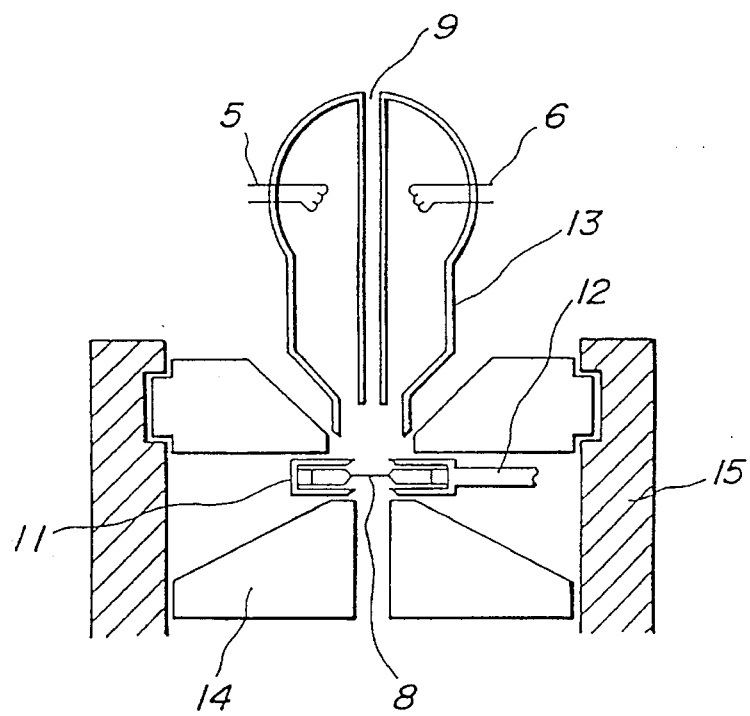

FIG._4(a)  FIG._4(b)  FIG._4(c)
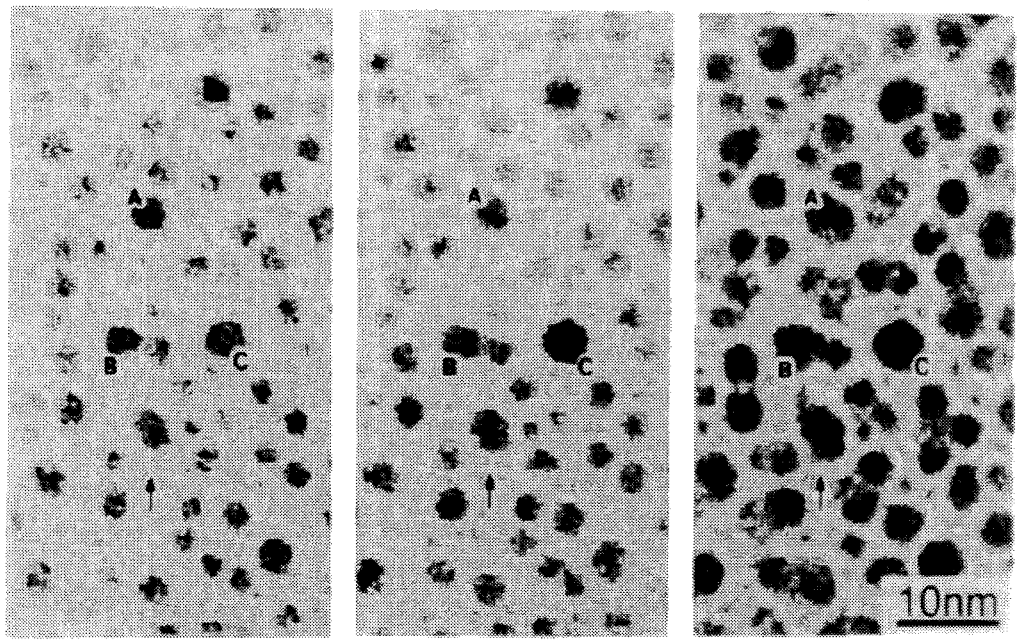
FIG._4(a')  FIG._4(b')  FIG._4(c')
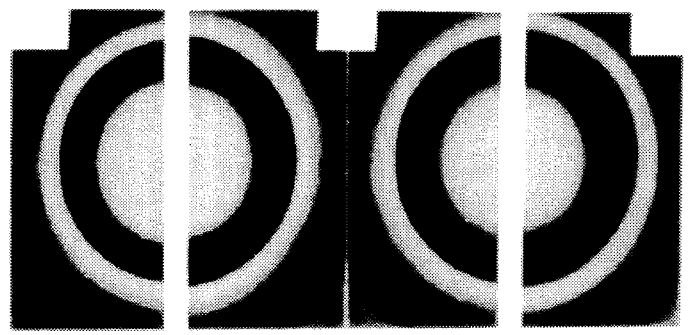

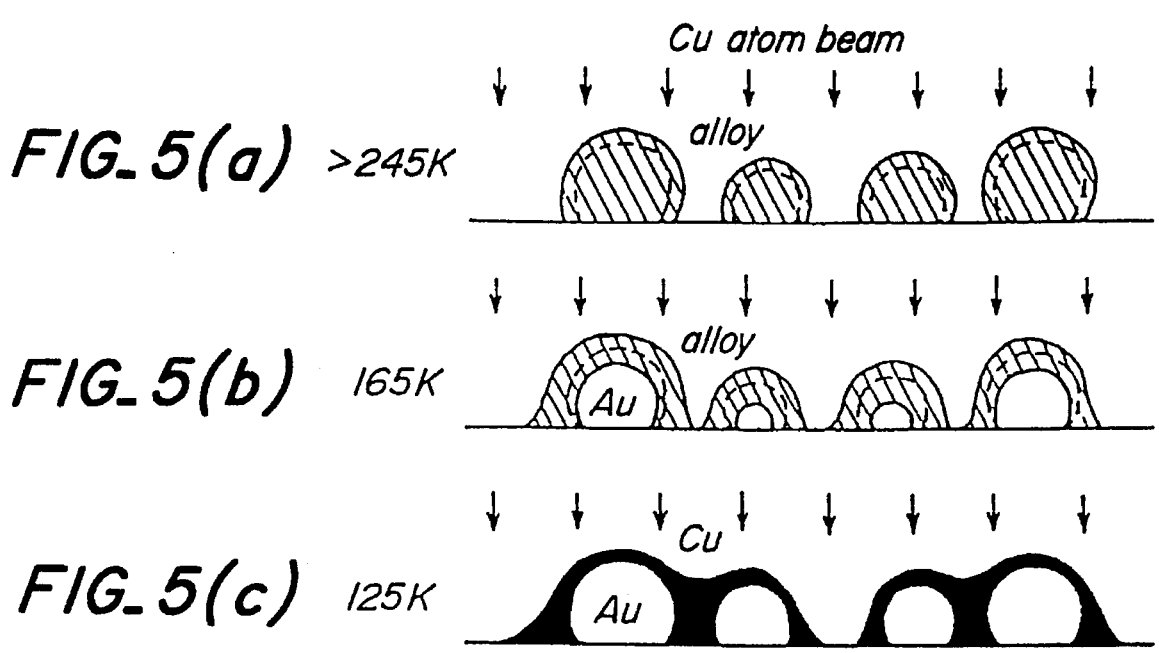

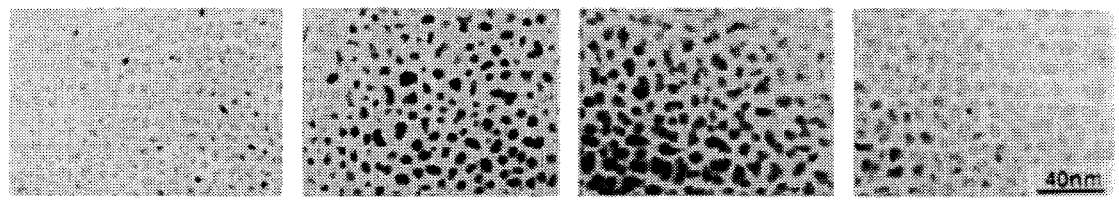
FIG_6(a)  FIG_6(b)  FIG_6(c)  FIG_6(d)
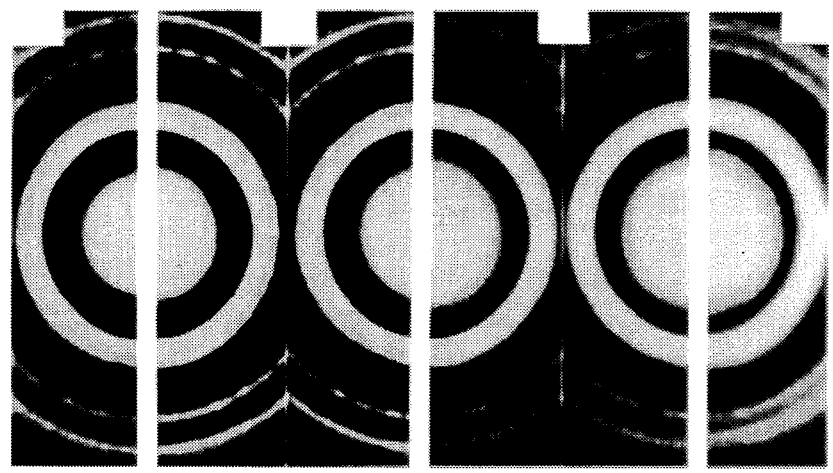
FIG_6(a')  FIG_6(b')  FIG_6(c')  FIG_6(d')
Au ← Zn, Ts=300K, S:am-C FIG. 7(a)   FIG. 7(b)   FIG. 7(c)   FIG. 7(d)
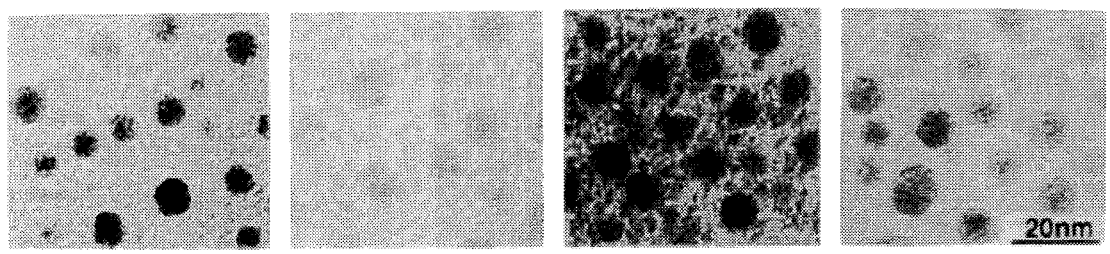
FIG. 7(a')   FIG. 7(b')   FIG. 7(c')   FIG. 7(d')
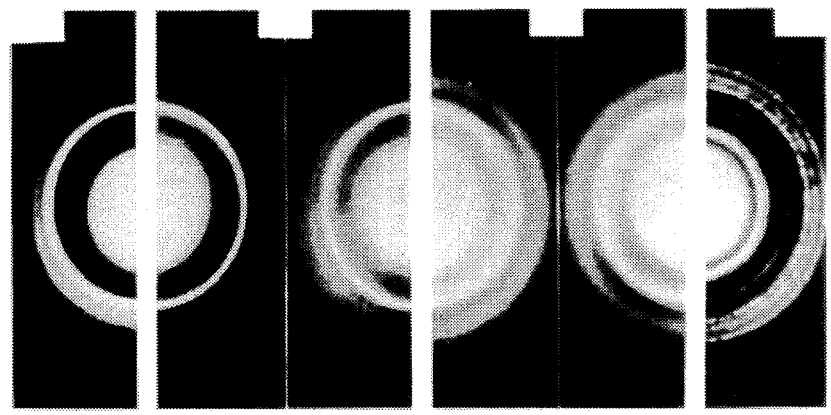

FIG_8(a) FIG_8(b) FIG_8(c) FIG_8(d)
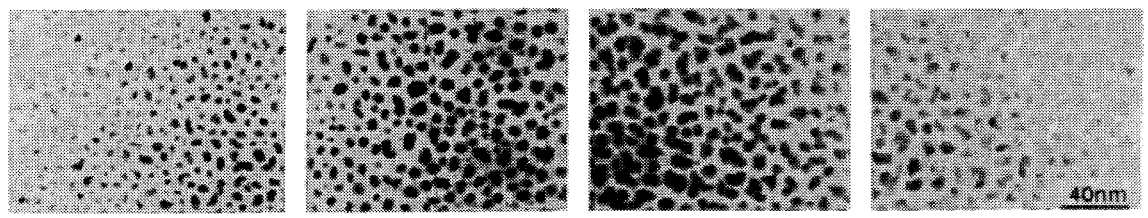
FIG_8(a') FIG_8(b') FIG_8(c') FIG_8(d')
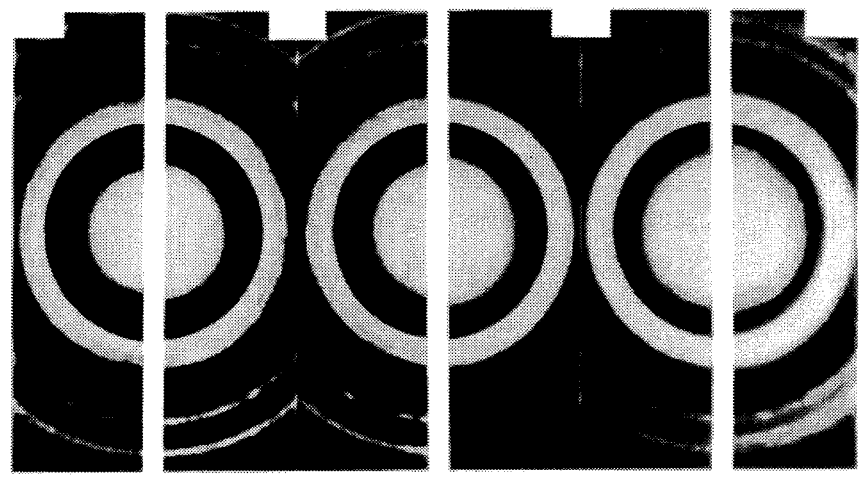
Au ◄ Zn, Ts=300K, S:am-C

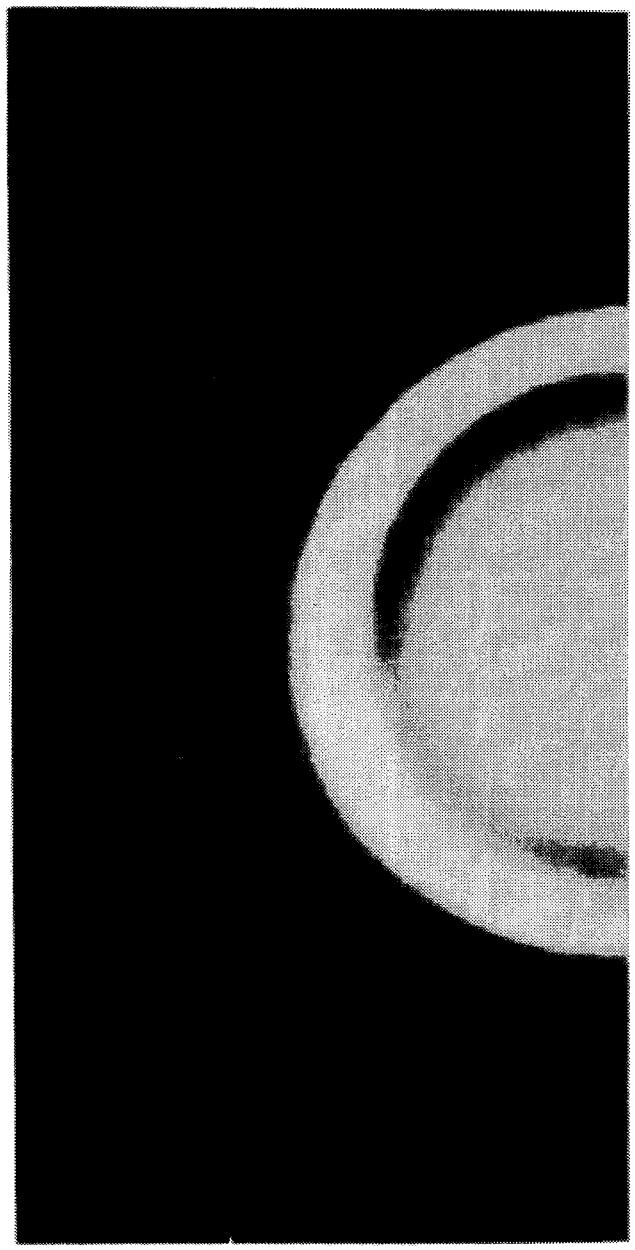
FIG_9
$\alpha_1$-$Au_3Zn$
131
113
122, 220
022
012, 020
002
111
011
010
001

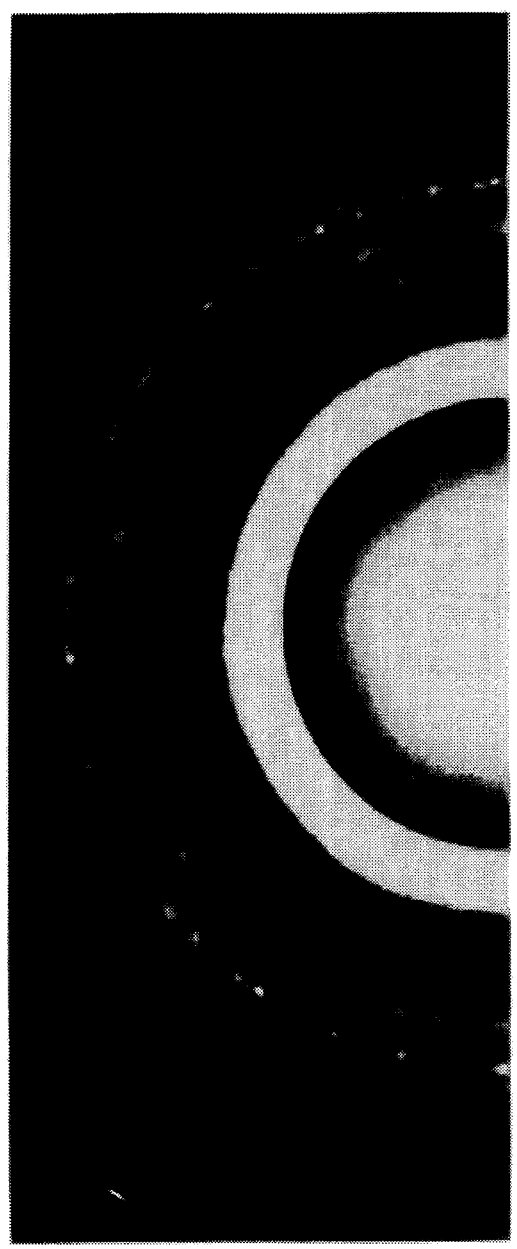
FIG_10

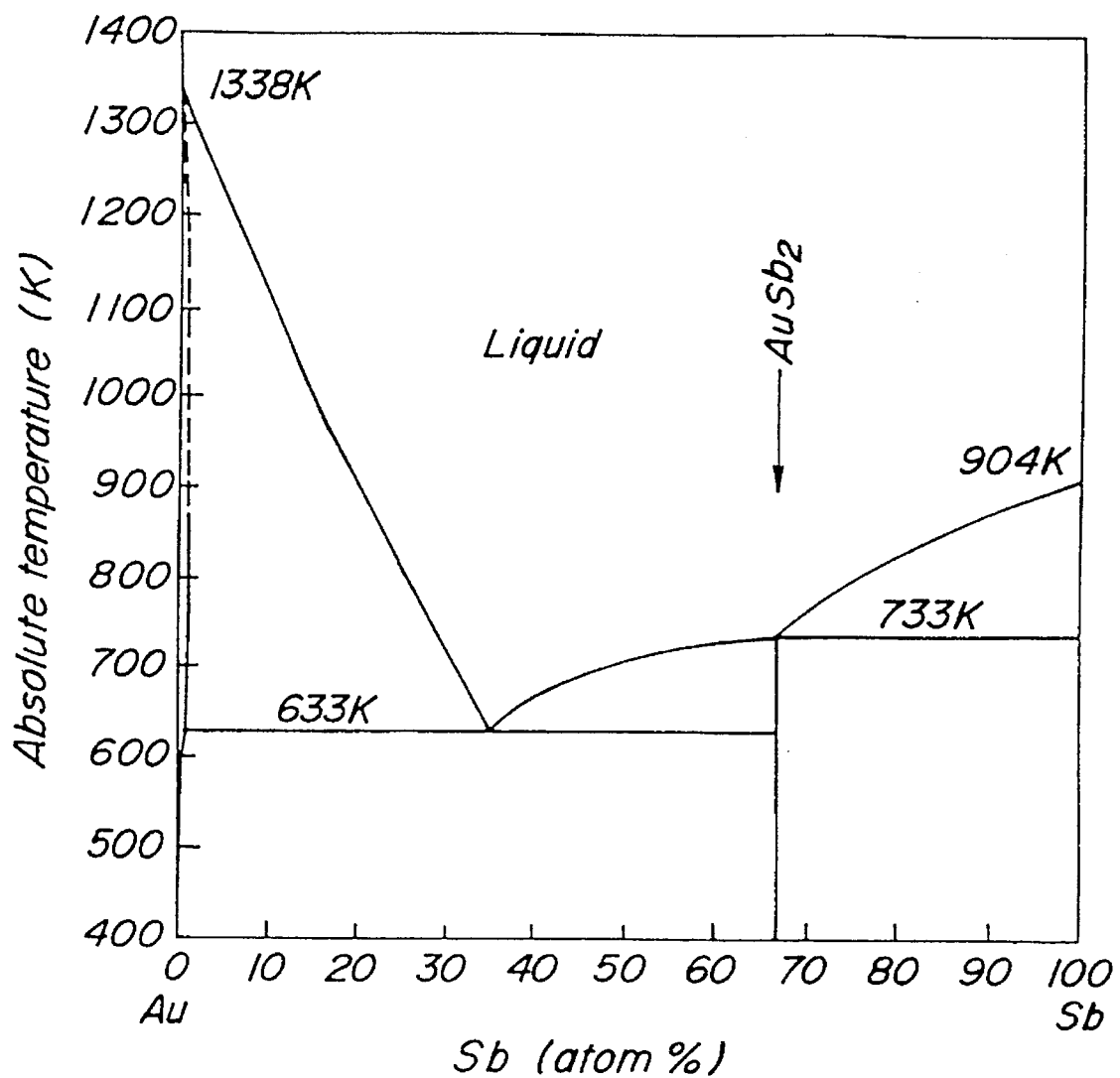
FIG_11

FIG._12(a)
FIG._12(b)
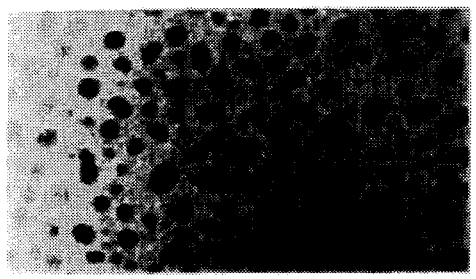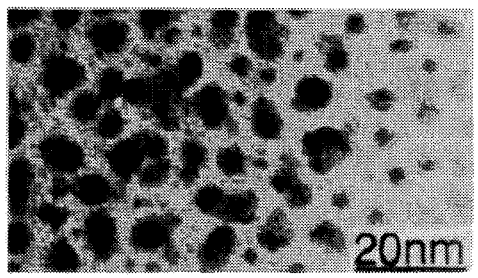
FIG._12(a')  FIG._12(b')

Sb+Au / C , 300K FIG_13
Sb+Au/C, 300K
AuSb₂

FIG_14(a)
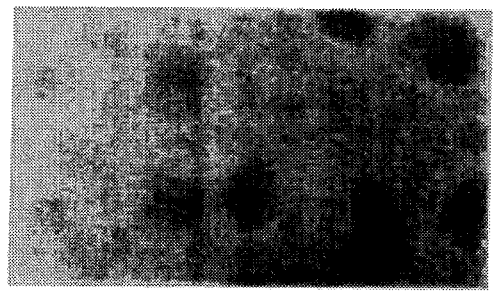
FIG_14(b)
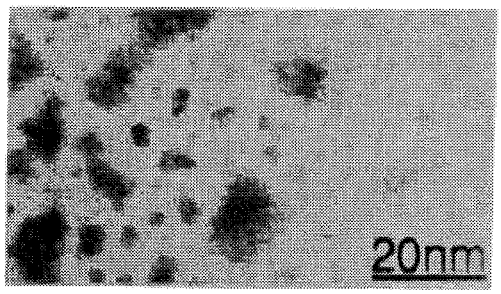
FIG_14(a')
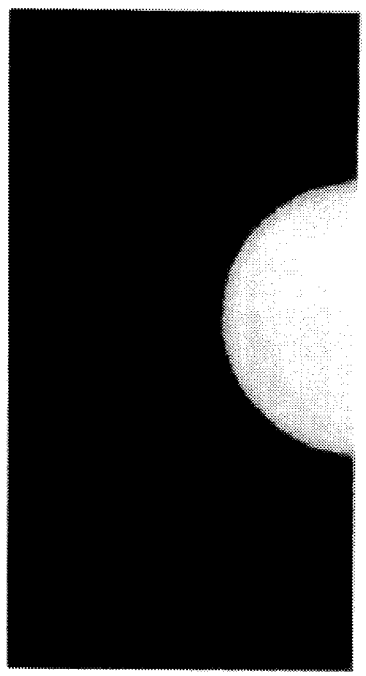
FIG_14(b')
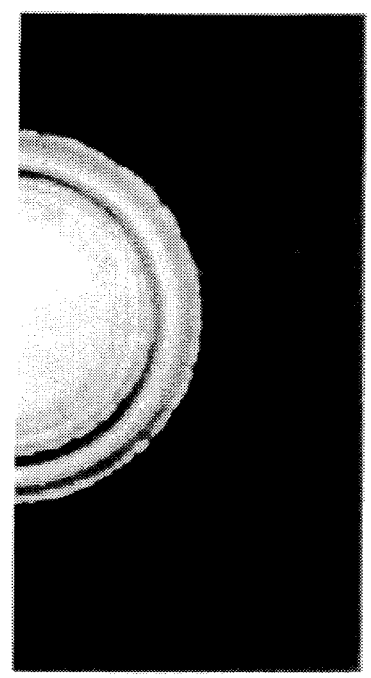
Au+Sb/C, 300K

FIG_15
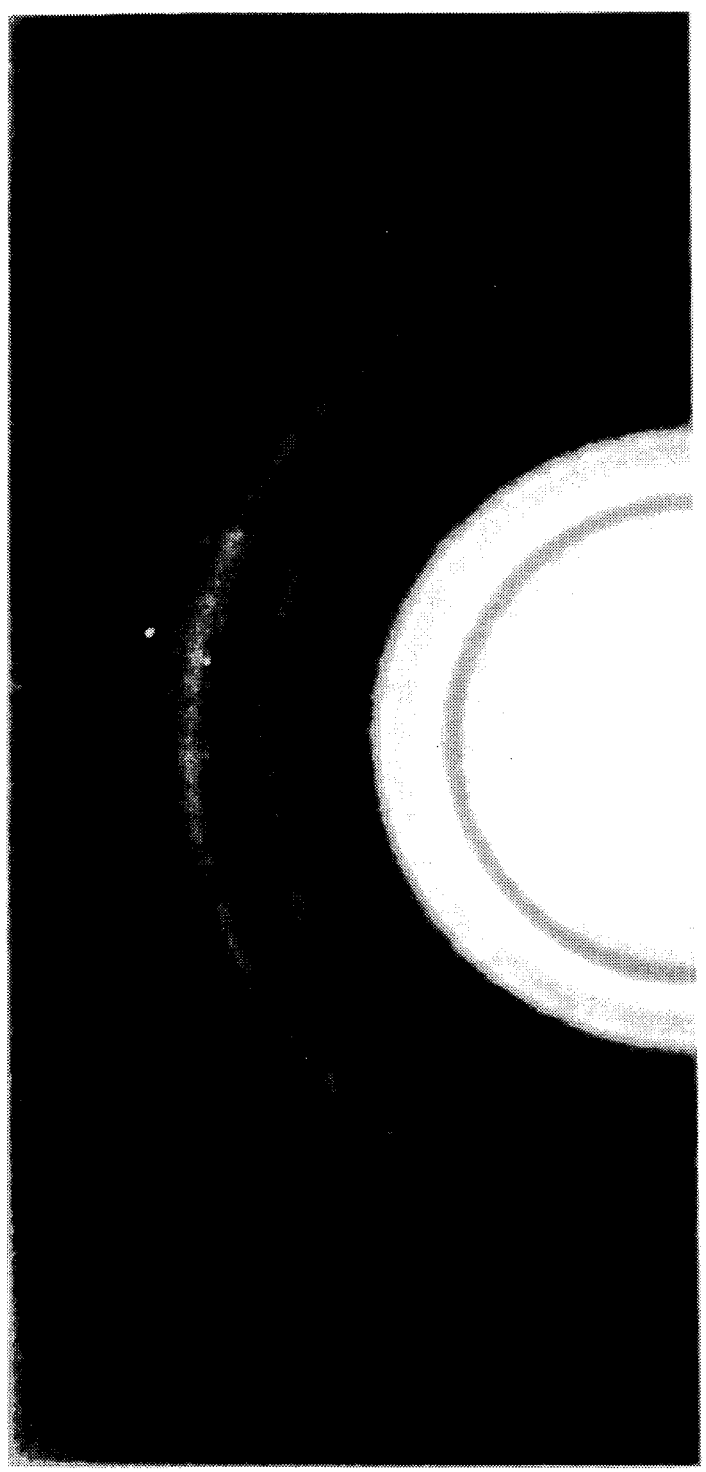
Au+Sb/C, 300K
AuSb$_2$

METHOD OF MANUFACTURING ULTRAFINE PARTICLES OF A COMPOUND

BACKGROUND OF THE INVENTION

1. Field of the Invention

The present invention is directed to a method of manufacturing ultrafine particles of a compound by utilizing a spontaneous alloying phenomenon which characteristically produces ultrafine particles of several nm in particle diameter.

Employing an essentially low temperature process, it is possible to efficiently obtain ultrafine particles of a compound whose diameter and composition are precisely controlled. The present invention thus provides ultrafine particles of a compound which are usable as a photocatalyst, a semiconductor, and a superconductive material, such as CdSe, AuZn, $AuSb_2$, InSb, GaAs, AlSb, ZnSe, $AuPb_2$, $Au_2Pb$, CdS, SiNi, $Si_2Ni$ and the like, which use value is very high.

2. Description of the Related Art

Ultrafine particles of about several nm in diameter have hitherto been manufactured by using various chemical and physical means at present. For example, a plasma CVD method belonging to the former includes decomposing the bond of a compound in a reactive gas by thermal plasma to form active atoms and molecules, and synthesizing ultrafine particles of a desired compound by their reaction. Moreover, a laser abrasion method belonging to the latter includes obtaining ultrafine particles by instantly vaporizing a solid target by laser irradiation, then quenching and coagulating it.

It is generally difficult to control particle diameter and composition by these means in relation to synthesis of ultrafine particles of a compound in such processes in which an excited atom rapidly falls to a stable state.

SUMMARY OF THE INVENTION

The present invention aims to solve the disadvantages of these prior methods and to obtain ultrafine particles of a compound having a desired particle diameter and composition.

The characterizing matter of the present invention is as follows.

An object of the invention is to provide a method of manufacturing ultrafine particles of a compound consisting of at least two elements on the surface of a substrate material selected from organic matter and inorganic matter comprising: depositing a first element of less than a critical size, such as 2–50 nm, on said substrate material surface by any one of vacuum deposition, sputtering, CVD and electron beam deposition, thereafter depositing a second element and the following elements of 2–50 nm, reacting on the substrate at a reaction temperature between below 32° C. and −173° C. and a vacuum of $10^{-11}$–$10^{-1}$ Torr, and successively depositing the elements at a deposition rate within a range for forming a compound by spontaneously alloying the first element and the following elements for a suitable time with a required area density.

An another object of the invention is to provide ultrafine particles of a compound selected from the group consisting of AuZn, $Au_3Zn$, $AuSb_2$, SbAu, InSb, CdSe, BaAs, AlSb, ZnSe, CdS, SiAl, SiNi $Si_2Ni$, $AuPb_2$, $AuPb_3$, $Au_2Pb$, $Cu_2Sb$, CuZn and SiGe of size below several nm in diameter obtained by the above-described manufacturing method.

In the present invention, substrate materials are selected from organic material and inorganic material, the following materials being available.

(1) Organic substrate materials:
polyacetylene
tetrachiofulvalene
phthalocyanine
anthracene
polystyrene.

(2) Inorganic substrate materials:
amorphous carbon (C)
graphite (C)
silicon oxide ($SiO_2$)
silicon carbide ($SiO_2$)
boron nitride (BN)
magnesium oxide (MgO)
silicon (Si)
germanium (Ge).

As a first element, at least one element selected from the group consisting of Au, Sb, In, Pb, Cu, Al, Cd, Se, Zn, Ga, Si and Ge is deposited on a substrate to form clusters (i.e., an ultrafine particle layer), an element selected from the group consisting of Zn, Sb, Au, In, Pb, Cu, Se, Cd, Al, Ga, Si and Ge is deposited as a second element on said substrate by vacuum deposition, CVD, sputtering or electron beam deposition, respectively, and the size of the ultrafine particles is made larger than 2 nm. The second element is deposited on the substrate material (i.e., amorphous carbon) at a deposition rate of $10^{10}/m^2$ s–$10^{20}/m^2$ $s^2$, and a deposition time: 1 second–3000 seconds,
area density: $10^{14}$–$10^{18}$ ($1/m^2$),
vacuum: $10^{-11}$–$10^{-1}$ (Torr),
temperature: below 32° C.—above −173° C. (100K)
substrate: amorphous carbon, compounds to be formed are AuZn, $Au_3Zn$, $AuSb_2$, SbAu, InSb, CdSe, GaAs, AlSb, ZnSe, CdS, SiAl, SiNi, $Si_2Ni$, $AuPb_2$, $AuPb_3$, $Au_2Pb$, $Cu_3Sb$, CuZn and SiGe.

In the present invention, a deposition rate for forming a compound by spontaneously alloying a first element and a second element and their following elements is about $10^{10}$–$10^{20}/m^2$ s. A deposition method for ultrafine particles is any one of vacuum deposition, electron beam deposition, sputtering or CVD (chemical vapor deposition). In short, it is possible to carry out any method by depositing at least two layers of ultrafine particles of several nm in diameter on a substrate and reacting there with each other.

BRIEF DESCRIPTION OF THE DRAWING(S)

FIGS. 1(a) and (b) are a principle explanatory view showing a method of manufacturing ultrafine particles of a compound according to an embodiment of the present invention;

FIG. 2 is a schematic diagram of an atom cluster generator for observing a specimen in situ with an ultra-high voltage electron microscope with 2 MV;

FIG. 3 is a schematic diagram of an atom cluster generator for observing a specimen in situ with a high-vacuum electron microscope of 200 kV;

FIGS. 4(a), (b), (c) and (a'), (b'), (c') show bright field images and electron diffraction patterns of Cu-Au clusters after depositing Cu at room temperature, respectively;

FIGS. 5(a), (b) and (c) are schematic diagrams showing temperature dependence of Cu alloying behavior in Au clusters at above 245K, 165K and 125K, respectively;

FIGS. 6(a), (b), (c), (d) and (a'), (b'), (c'), (d') are bright field images and electron diffraction patterns showing the alloying behavior of Zn into A1 clusters at room temperature, respectively;

FIG. 6(a) is a bright field image of Au clusters;

FIGS. 6(b) and (c) are bright field images of Au clusters after Zn deposition for 90 seconds and for 270 seconds at a deposition rate of about $2.10^{17}$ atoms.m$^2$.s$^{-1}$, respectively;

FIG. 6(d) is a bright field image when a net deposition amount of Zn is made to about 50 at %;

FIGS. 6(a'), (b'), (c') and (d') are electron diffraction patterns corresponding to the bright field images of FIG. 6(a), (b), (c) and (d);

FIGS. 7(a), (b), (c), (d) and (a'), (b'), (c'), (d') are bright field images and the corresponding electron diffraction patterns showing a typical example of spontaneous alloying behavior of Sb in In clusters, respectively;

FIGS. 8(a), (b), (c), (d) and (a'), (b'), (c'), (d') are bright field images and the corresponding electron diffraction patterns showing a typical example of the alloying behavior of zinc in metal clusters, respectively;

FIG. 9 is an enlarged view indexing an electron diffraction pattern of the $\alpha_1$-Au$_3$Zn shown in FIG. 8(c');

FIG. 10 is an enlarged view indexing an electron diffraction pattern of the $\beta'$-AuZn and the $\alpha_1$-Au$_3$Zn shown in FIG. 8(d');

FIG. 11 is a phase diagram of the Au-Sb system;

FIGS. 12(a), (b) and (a'), (b') are bright field images showing spontaneous alloying of Sb atoms in Au clusters an amorphous carbon film at room temperature and the corresponding electron diffraction patterns;

FIG. 13 is an enlarged view of the electron diffraction pattern shown in FIG. 12(b');

FIGS. 14(a), 14(b) and 14(a'), 14(b') are a bright field image of antimony clusters formed on an amorphous carbon film and the corresponding electron diffraction pattern; and FIG. 15 is a view showing an enlargement of the electron diffraction pattern.

In the Figures, number 1 is a substrate, 2 is an ultrafine particle (cluster), 3 is an atom, 4 is a compound, 5 is a first element evaporation source, 6 is a second element evaporation source, 7 is a shutter, 8 is a supporting film (substrate), 9 is an electron injection hole, 10 is a top entry type specimen holder, 11 is a side entry type specimen holder, 12 is a cold chip end, 13 is an insulating vacuum chamber, 14 is a pole piece, and 15 is a partition.

DESCRIPTION OF THE PREFERRED EMBODIMENTS

Figure 1A:
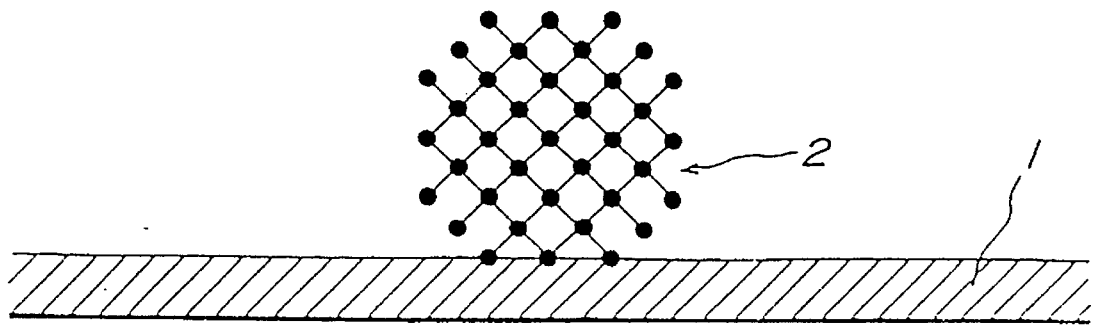
Figure 1B:
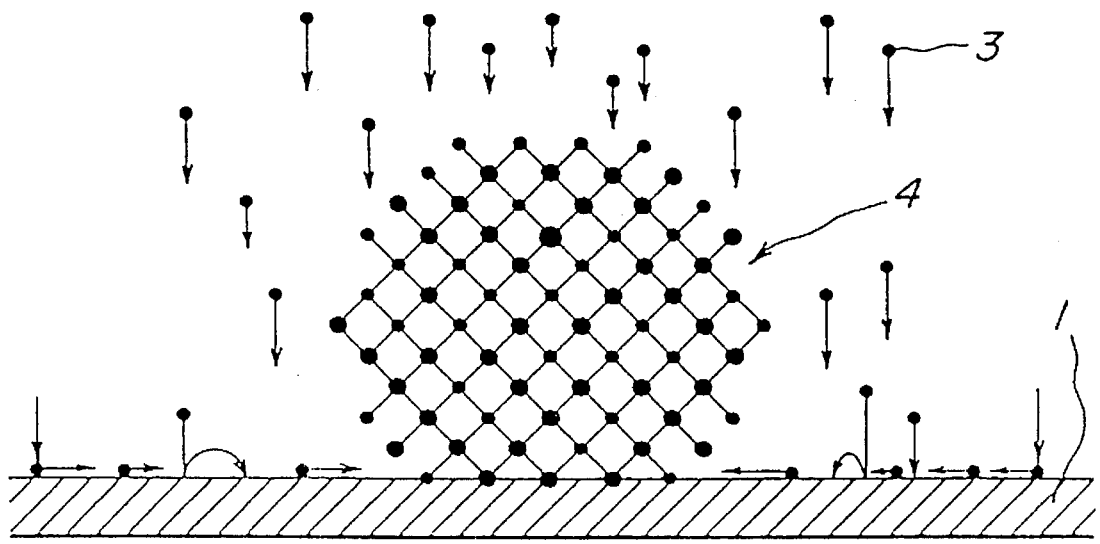

One embodiment of the invention will be explained by referring to the drawings in detail. As shown in FIG. 1, at first, an ultrafine particles 2 of pure material A is formed on the surface of a substrate 1 kept at room temperature (see FIG. 1(a)). This ultrafine particle 2 is formed by slowly depositing an atom of pure material A by any one method selected from the group of vacuum deposition, sputtering, electron beam deposition or CVD. According to this means, particle diameter can be controlled with high precision by co-using electron microscopy. Next, atoms 3 of pure material B on these ultrafine particles 2 of pure material A are slowly deposited by the same method. Then, the atom 3 of material B is rapidly dissolved into the ultrafine particle 2 of pure material A (see FIG. 1(b)), to form a compound 4 at the time of reaching a predetermined composition. This compound formation occurs almost instantly at room temperature. The discovery of this rapid compound formation phenomenon is the basis of the present invention. Such rapid dissolution of heterogeneous atoms and the following compound formation (which is designated as spontaneous alloying hereinafter) are generated only when the particle diameter of the ultrafine particle 2 of pure material A is less than a critical particle diameter determined by material. Moreover, the alloy forming rate of this spontaneous alloying is several orders of magnitude faster compared with the alloy forming rate expected from the usual bulk diffusion coefficient.

According to the manufacturing method of the essentially low temperature process of the present invention, it is possible to obtain ultrafine particles of a compound whose particle diameter and composition are precisely controlled and with high density (i.e., area density).

TABLE 1

| Pure material A | Pure material B | Deposition method * | Rate and time of deposition of B | Size of A (nm) | Compound to be formed | Area density (1/m$^2$) |
| --- | --- | --- | --- | --- | --- | --- |
| Au | Zn | vacuum deposition | $10^{18}$/m$^2$s, 450s | 7 | AuZn | $3 \times 10^{16}$ |
| Au | Sb | vacuum deposition | $10^{18}$/m$^2$s, 60s | 4 | AuSb$_2$ | $3 \times 10^{16}$ |
| In | Sb | vacuum deposition | $10^{18}$/m$^2$s, 60s | 8 | InSb | $9 \times 10^{15}$ |

* Note: All substrate temperatures are room temperature.

An example of the present invention is shown below.

EXAMPLE 1

(1) Object of Experiment

The properties of atom clusters of about several nm in particle diameter are remarkably different compared with those of corresponding atoms and molecules, and further compared with those of bulk solids. As an example of the latter, the increase of lattice specific heat in gold clusters is known, as is the increase of photocatalytic activities in semiconductor catalysts, and the like. The cause of such special physical properties is considered to be the "size effect". The "size effect" is due to the fact that the size of the region relates to the behavior of electron and lattices in solids, and governs the size of clusters, and to the fact that a "surface effect" results due to the fact that the number of atoms occuping the surface become larger than the whole number of atoms constructing the clusters.

The present inventors have aimed to particularly examine the appearance of special physical properties due to the size effect of metal clusters and the cause thereof, and have proceeded to conduct various studies. As one of these various studies, a study of "Interdiffusion in Metal Clusters" was tried. In this study, the inventors have manufactured an atom cluster generator for observing a specimen in situ with an ultra-high voltage electron microscope of 2 MV and a high vacuum electron microscope of 200 kV, and have systematically examined the rapid alloying behavior observed in atom clusters. FIG. 2 shows a schematic diagram of the atom cluster generator for observing a specimen in situ with an ultra-high voltage electron microscope of 2 MV. FIG. 3 further shows a schematic diagram of the atom cluster generator for observing a specimen in situ with a 200 kV high vacuum electron microscope. In FIG. 2, 5 is a first element evaporation source, 6 is a second element evaporation source, 7 is a shutter provided therebetween, 8 is a supporting film as a substrate for forming atom clusters, 9 is an electron passage, and 10 is a top entry type specimen holder. In FIG. 3, 5 is a first element evaporation source, 6 is a second element evaporation source, 8 is a supporting film as a substrate for forming atom clusters, 11 is a side entry type specimen holder for the supporting film 8, 12 is a cold ship, 13 is an insulating vacuum chamber, 14 is a pole piece and 15 is a partition. As a result of an experiment conducted by using the devices shown in FIGS. 2 and 3, it became clear that when Cu is deposited on Au clusters of about several nm having no structural instability at room temperature, extremely rapid alloying, which phenomenon cannot be expected in bulk solids, alloying, which phenomenon cannot be expected in bulk solids, occurs.

(2) Atom cluster generator for observing a specimen in situ with an electron microscope:

In order to simultaneously carry out formation and observation of metal clusters, atom cluster generators were detachably mounted to a 2 MV ultra-high voltage electron microscope and to a high-vacuum 200 kV electron microscope. Both of these devices are of deposition type, and can independently generate heterogenous metal clusters by heating a tungsten filament of double source.

FIG. 2 shows a schematic diagram of an atom cluster generator mounted in a specimen chamber of a 2 MV ultra-high voltage electron microscope. A supporting film 8 for clusters is positioned at a top entry type specimen holder 10. At a position about 85 mm above this supporting film 8 are arranged a first element evaporation source 5 and a second element evaporation source 6 fixed to ring-like filaments in two columns, and a partition shutter 7 is fixed between the filaments.

An atom cluster generator for a 200 kV electron microscope was designed and manufactured with the same concept. FIG. 3 shows a schematic diagram thereof. A supporting film 8 for clusters is positioned at a side entry type specimen holder 11. Above the supporting film 8, a first element evaporation source 5 and a second element evaporation source 6, which is fixed to a tungsten basket for specimen evaporation, are separately arranged at a position about 100 mm. The vacuum in specimen chamber is 5×10⁻⁷ Torr. The circumference of the supporting film 8 and first and second element evaporation sources 5, 6 are surrounded by an insulating vacuum chamber 13, and cold ship 12 is cooled to liquid nitrogen temperature, so as to try to improve the degree of the vacuum.

With the use of these devices, an alloying behavior of clusters was examined in the following steps.

(1) The evaporation source 5 was made of Au and the evaporation source 6 was made of Cu or Zn. As the supporting film 8, use was made of amorphous carbon of about 10 nm in thickness mounted on an Mo mesh. The supporting film 8 was heated at 363° K. for 30 seconds within the electron microscope before use.

(2) While observing through the electron microscope, Au was deposited on supporting film 8 held at room temperature, and the deposition was stopped at the time when Au clusters having a predetermined size were formed by island growth.

(3) The temperature of the supporting film 8 carrying the deposited Au cluster was changed to 125K, and a proper amount of Cu or Zn was deposited thereon. Deposition rates of Cu and Zn were about $10^{18}$ atoms.m⁻².s⁻¹ and $10^{17}$ atoms.m⁻².s⁻¹, respectively. The form of the clusters and the change of structure with this deposition were followed by observing a bright field image and an electron diffraction pattern.

The present invention shows the result of using a 200 kV electron microscope. Moreover, electron flux at the time of observing through the electron microscope was less than $10 \times 10^{21}$ e.m⁻².s⁻¹.

(3) Alloying behavior of Cu in Au clusters:
(3)-1 Observation in situ of alloying behavior of Cu in Au clusters:

In FIG. 4, a growing process of clusters in the same area was pursued when Cu was deposited on Au clusters on a supporting film held at room temperature. Arrows indicate the same position. FIGS. 4(a) and 4(a') are a bright field image and an electron diffraction pattern of Au clusters formed on amorphous carbon support films, respectively. The Au cluster size in this case was 3.0 nm in mean particle diameter. In the electron diffraction pattern, Debye rings of Au having a face centered cubic (fcc) structure were observed. FIGS. 4(b) and (b') are a bright field image and an electron diffraction pattern of the same position after deposition of Cu for 5 seconds. After deposition, the mean particle diameter of clusters increased up to 3.5 nm. An association with this increase, the electron diffraction pattern changed to Debye rings of a fcc crystal structure with lattice constant of 0.397 nm. FIGS. 4(c) and (c') are a bright field image and an electron diffraction pattern after deposition of Cu for an additional 30 seconds. With deposition, the mean particle diameter of clusters increased to 5.0 nm. According to the Debye rings, the mean value of the lattice constants of face the centered cubic crystals was reduced to 0.375 nm. In corresponding electron diffraction patterns shown under each of the bright field images 4(a), 4(b) and 4(c), the diameter of the Au 111 Debye ring increased with deposition of Cu. With the increase upon deposition, the width of Debye ring depends upon the composition distribution of alloy clusters and spreads to some extent. One more important point understood from this observation is that the relative position of individual clusters does not change through a series of Cu depositions. That is, the growth of the clusters is generated without any accompanying remarkable movement of the center of gravity. This result agrees with Honjo et al.'s result that the movement of Au clusters on graphite is caused by an external factor such as electron irradiation, but not by an intrinsic property of the clusters.

The result of observation in situ in FIG. 4 is summarized as follows.

(1) A part of the Cu atoms to be deposited directly impinge on the Au clusters, but almost all surface diffuse into contact with the Au clusters. The contacting Cu atom is instantly solved into the Au clusters to form uniform Au-Cu solid solution clusters. This alloying is generated without movement of each cluster on the supporting film.

(2) On the assumption that the same relation between the lattice constant and the composition as in bulk solids is established in clusters, alloy compositions having lattice constants of 0.397 nm (FIG. 4(b)) and 0.275 nm (FIG. 4(c)) would correspond to Au-25 at % Cu and Cu-76 at % Au, respectively.

FIGS. 5(a), 5(b) and 5(c) are schematic diagrams showing temperature dependence of Cu alloying behavior in Au clusters. A broken line in the particles shows initial Au clusters. Au clusters of 4 nm in mean particle diameter form a uniform solid solution with Cu at above 245K. At 165K, some Au remains, but all of the Cu contributes to alloying, and two-phase clusters are formed in which Au clusters are enveloped with an Au-Cu solid solution layer. At 125K, no alloying occurs.

A simple relationship between the diffusion distance and the time is shown by the following equation:

$$x=(Dt)^{1/2}.$$

Here, D is the diffusion coefficient and t is the time needed to achieve diffusion of solute atoms over a distance x. In order to roughly estimate the diffusion coefficient in Au clusters, if x=1.5 nm (corresponding to ½ of the mean particle diameter 3.0 nm of Au clusters in FIG. 4(a)) and t=20 seconds (time from completion of deposition to photographing electron diffraction patterns), $D=1.1\times10^{-19}$ $m^2.s^{-1}$ is obtained. The alloying actually occurs in shorter time than 20 seconds, so that this value shows a lower limit value of the diffusion coefficient.

On the other hand, the diffusion coefficient of Cu in bulk Au is shown by the following equation:

$$D_{Cu-Au}=(1.2\times10^{-7})\exp(-14300/T) \ [m^2.s^{-1}].$$

Extrapolation of this relationship to room temperature (T=300K) gives a value of $D_{Cu-Au}=2.4\times10^{-28} m^2.s^{-1}$. Therefore, it is understood that the diffusion rate of Cu in measured Au clusters is at least 9 orders of magnitude faster than that in bulk Au.

Moreover, an ordered alloy, such as CuAu, $Cu_3Au$ and the like, is present in a low temperature zone of this system, but all of the obtained alloy clusters were found to be disordered solid solutions.

(3)-2 Low temperature alloying in Au clusters:

The alloying behavior or Cu in Au clusters of 4 nm mean particle diameter is summarized as follows. FIG. 5 schematically shows these behaviors. (1) Above 245K, uniform Au-Cu solid solutions are formed. (2) At 165K, Au remains in part, but all of the Cu contributes to alloying, and two phase clusters are formed of Au clusters enveloped with an Au-Cu solid solution layer. (3) At 115K, no alloying occurs. (4) When the diffusion coefficient of Cu in Au clusters of 4 nm in mean particle diameter is roughly estimated at 235K, a value of $2.0\times10^{-13} m^2.s^{-1}$ is obtained. This value is more than 14 orders of magnitude larger than that in bulk Au.

(4) Formation of a compound by alloying Zn in Au clusters:

FIG. 6 shows changes of a bright field image and an electron diffraction pattern corresponding to alloying behavior into Au clusters when Zn is deposited on Au clusters at room temperature. FIGS. 6(a) and 6(a') are a bright field image and an electron diffraction pattern of Au clusters as they are, respectively. The mean particle diameter of Au clusters is 5 nm. FIGS. 6(b) and 6(b') are a bright field image and an electron diffraction pattern of Zn after deposition at the deposition rate of about $2\times10^{17}$ $atoms.m^2.s^{-1}$ for 90 seconds. The mean particle diameter of clusters increases to 6.5 nm by this additional deposition of Zn. The corresponding electron diffraction pattern shows Debye rings of face centered cubic crystals, and increasing the particle diameter, increases the ring intensity. However, any more change of the diameter than the measuring error cannot be observed as compared with that of pure Au. The solubility of Zn in Au is about 15 at % at room temperature (about 30 at % at 700K) and the change of the lattice constant associated with formation of a solid solution is less than 1%. The fact of observing no Debye rings of Zn in the electron diffraction pattern of FIG. 6(b') photographed within 20 seconds after completing the deposition of Zn shows that Zn deposited in this period is diffused into Au clusters to form solid solution clusters. FIGS. 6(c) and 6(c') are a bright field image and an electron diffraction pattern after Zn is deposited at substantially the same deposition rate for 180 seconds in addition to the state of FIG. 6(b). The mean particle diameter of the clusters is increased to 9 nm by additional deposition of Zn. The corresponding electron diffraction pattern changes to a shape which is clearly different from that of the Debye rings of a face centered cubic crystal. FIG. 6(d) and 6(d') are a bright field image and an electron diffraction pattern after the total deposition amount of Zn is made, about 50 at % to Au. In this case, the mean particle diameter of clusters is increased to 10 nm. The corresponding electron diffraction pattern 6(d') shows the Debye rings of a B2 structure having a lattice constant of 0.319 nm, and shows formation of an inter-metallic compound β'-AuZn phase. It was confirmed from this result that rapid alloying occurs not only in the system for forming an intermediate phase, but also in the solid solution system.

(5) Conclusion

As represented by atom clusters, physical properties revealed when the size of a solid becomes small receive a remarkable influence. In the study of the present invention, an atom cluster generator for observing a specimen in situ with an electron microscope was manufactured for trial, and special physical properties revealed in the clusters were measured and analyzed by effective means in a microregion, such as that in a electron microscopy, with the use of this generator. Concretely speaking, the present inventors noticed the mutual diffusion as a special physical property revealed in atom clusters and systematically examined the alloying behavior in metal clusters. As a result, the following knowledge of Au clusters of about several nm in diameter was obtained.

(1) When a Cu atom contacts a Au cluster, the Cu atom rapidly diffuses into the inside of the Au cluster and alloys to form a solid solution cluster. This alloying is generated even at 165K.

(2) Even in the Au-Zn system existing as an intermediate phase on the equilibrium diagram, the same alloying is generated. In this system, clusters are formed in association with the increase of a Zn composition change from solid solution clusters to intermetallic (β'-AuZn) clusters.

The rapid alloying in atom clusters is not an artifact, but due to an intrinsic property of clusters.

EXAMPLE 2

Formation of In-Sn clusters by spontaneous alloying:

(1) Object of Test

As one special physical property of nanometer sized clusters, rapid alloying is mentioned. That is, the present inventors have recently found that the interdiffusion in such clusters is 9 orders of magnitude faster than that in the bulk solid. It is important to clarify the universality of such special alloying behavior and the stability of the formed phase for clarifying the agglomerated form of clusters. In the study of the present invention, for the purpose of examining the behavior of the system where a semiconductor compound is formed by alloying, there was selected an In-Sb system in which exists a III–V series semiconductor compound was selected.

(2) Test method

The alloying behavior of Sb in In clusters has been pursued by means of an electron microscope image and an electron diffraction pattern with the use of a double source evaporator set in a high vacuum electron microscope. Indium (In) clusters of a predetermined size were formed on an amorphous carbon supporting film, and antimony (Sb) was deposited at room temperature. Changes in the shape and the structure associated with the deposition were observed in situ.

(3) Test result

In FIG. 7, a typical example of the spontaneous alloying behavior of Sb in indium (In) clusters is shown.

Indium (In) clusters of 8 nm in mean particle diameter, which are different from In bulk solids of a face centered cubic crystal structure, have a face centered cubic crystal structure with a lattice constant of a=0.471 nm (FIGS. 7(a), 7(a')). When Sb is deposited on the clusters at room temperature, Sb atoms rapidly diffuse into In clusters to form face centered cubic crystalline solid solution clusters (FIG. 7(b), 7(b')), and when the amount of Sb deposited is further increased, the Sb atoms become a nonequilibrium alloy phase (FIGS. 7(c), 7(c')). When the amount of Sb deposit is increased up to about 50 at %, the Sb changes to InSb semiconductor compound clusters. As a result of analyzing the Debye rings, it was found that the InSb clusters are not a zincblende structure, but become a wurtzite structure with lattice constants of a=0.457, c=0.761 nm. On the other hand, InSb clusters formed by thermal annealing of Sb in In clusters take a zincblende structure, so that it is considered that the structured of the compound clusters remarkably depend on the formation process. This spontaneous alloying is deduced when the initial particle diameter of In is increased to about 20 nm, and two phase clusters of In and InSb are formed. Moreover, even if Sb is deposited on In clusters at 123K, spontaneous alloying never occurs.

EXAMPLE 3

Formation of compound clusters by spontaneous alloying:

(1) Object of Test

As one of specific physical property of nanometer sized clusters, rapid alloying is mentioned. That is, the present inventors have recently proved that extremely rapid alloying is generated in such clusters as compared with bulk solids, and solid solution clusters are spontaneously formed. The cohesion of the clusters can be understood by clarifying the mechanism of such special alloying behavior and the stability of the formed phase.

In order to compare compound formation behaviors in different bonding systems, the study of the present invention selected existing systems (1) intermetallic compound (8 coordination, metallic bond), (2) molecular lattice compound (6 coordination, covalent bond), and (3) compound semiconductor (4 coordination, covalent and ionic bond) as objects.

(2) Test method

Pure clusters of a predetermined size were formed on an amorphous carbon supporting film with the use of a high vacuum electron microscope and a double source evaporator set in a UHV specimen chamber, and foreign atoms were deposited at room temperature. The alloying behavior of foreign atoms in pure clusters was pursued by means of an electron microscope image and an electron diffraction pattern, and changes in the shape and the structure were observed in situ.

(3) Test result

① AuZn intermetallic compound

When Zn is deposited on Au clusters of 6.5 nm in mean particle diameter up to about Au-25 at % Zn at room temperature, Zn atoms are alloyed with the Au clusters and $\alpha_1$-Au$_3$Zn clusters are formed. This compound is a stable disordered phase at above 543K in the bulk solid. Moreover, when the total deposition about of Zn is increased up to about Au-40 at % Zn, this cluster transits to a $\beta'$-AuZn cluster. This $\beta'$-AuZn is an ordered phase with a cesium chloride structure.

② AuSb$_2$ molecular latticed compound

When Sb is deposited on Au clusters of 4 nm in mean particle diameter at room temperature, AuSb clusters are formed. This AuSb$_2$ is pyrite type compound and takes the same structure as that of the bulk solid.

③ InSb compound semiconductor

Indium (In) clusters of 8 nm in mean particle diameter have face centered cubic crystal structure with a lattice constant of a=0.471 nm. When Sb is deposited onto this cluster at room temperature, Sb atoms are alloyed with In clusters and become a nonequilibrium alloy phase. When the amount of deposited Sb is increased up to about In-50 at % Sb, the clusters change to InSb semiconductor compound clusters of a single phase. The InSb clusters formed here do not have the zincblende structure of the bulk solid, but have the wurtzite structure with lattice constants of a=0.457, c=0.761 nm.

The structural characteristics in compound clusters are summarized from the above results as follows.

① The metallic and covalent compound clusters take the same structure as those of the bulk solids. Moreover, the high temperature phase is stabilized.

② With increasing ionicity, the zincblende structure changes to the wurtzite structure and to the cesium chloride structure (, and to rock salt structure).

EXAMPLE 4

Spontaneous alloying of zinc atoms in gold clusters and formation of compound clusters:

The alloying behavior of zinc atoms into gold clusters has been studied using a 200 kV transmission electron microscope equipped with a double-source evaporator in the specimen chamber. Isolated gold clusters were first prepared on a support film of amorphous carbon, and zinc atoms were then deposited onto the same film. (Hereafter ultrafine particles are designated as atom clusters or simply clusters.) Upon the deposition of Zn, the gold clusters quickly changed into Au-Zn solid solution clusters, disordered $\alpha_1$-Au$_3$Zn clusters or ordered $\beta'$-AuZn clusters depending on the amount of deposited Zn. The spontaneous alloying which results in the formation of compound clusters was observed for the first time.

Ultrafine particles in the size range from 1 to several nm exhibit physical and chemical properties that are significantly different from those of bulk solids. For example, dramatic changes have been found in such properties as electronic, optical, magnetic and photocatalytic properties as the size of the clusters decreases. To the present inventors' knowledge, the diffusional properties of atom clusters have not been explored. Quite recently it was found by the present inventors that even at room temperature a rapid spontaneous dissolution of copper atoms takes place in nm-sized gold clusters and solid solution clusters are formed. The Au-Cu binary system is a typical solid solution system. In the study of the present invention, an attempt was made to see whether or not a similar spontaneous alloying takes place in systems where there exist intermediate phases in the phase diagram, the alloying behavior of zinc atoms into nm-sized gold clusters has been investigated by carrying out in situ experiments with a high-vacuum electron microscope.

Preparation of gold clusters and subsequent zinc deposition onto the gold clusters were carried out with the use of a double-source evaporator which was set in the specimen chamber of an electron microscope. The evaporator consists of two spiral-shaped filaments made of tungsten. The distance between the filaments and a supporting film (substrate) for atom clusters is approximately 100 mm. Amorphous carbon film was used as the supporting film, and was mounted on a molybdenum grid. It was sintered out at the absolute temperature of 363K for 30 seconds in the electron microscope prior to the experiments. With the use of this evaporator, gold was first evaporated from one filament onto the supporting film, and gold clusters of approximately 6.5 mm in mean particle diameter were produced on the supporting film. Zinc was then evaporated from the other filament onto the same film kept at the absolute temperature of 300K. The fluxes of gold and zinc were of the order of $10^{17}$–$10^{18}$ m$^{-2}$s$^{-1}$. The morphology and structure of the clusters associated with the deposition of zinc were studied by means of transmission electron microscopy (TEM). The microscope was operated at an accelerating voltage of 200 kV and was equipped with a turbo-molecular pumping system to achieve a base pressure of around $5\times10^{-5}$ Pa in the specimen chamber. The electron flux used was approximately $1.5\times10^{20}$ cm$^{-2}$s$^{-1}$, and is quite low compared to that used in previous high-resolution electron microscopy.

FIG. 8 shows the alloying behavior of zinc atoms into gold clusters observed by TEM. FIGS. 8(a) and 8(a') show a bright field image (BFI) of gold clusters formed on a supporting film of amorphous carbon and the corresponding selected-area electron diffraction pattern (SAED), respectively. The Debye-Scherrer rings in the selected-area electron diffraction pattern (SAED) consistently indexed as rings of face centered cubic gold clusters. The mean size of the gold clusters was 6.5 nm in diameter. FIGS. 8(b) and 8(b') show a bright field image (BFI) of the clusters after deposition of zinc for about 90 seconds and the corresponding selected-area electron diffraction pattern (SAED), respectively. These photographs were taken immediately after the deposition, namely, less than 20 seconds after the zinc atom beam was turned off. With the deposition of zinc, the mean cluster size increased from 6.5 nm to 7.0 nm in diameter. The Debye-Scherrer rings in the SAED can systematically be indexed as those of a face centered cubic crystal with a lattice constant of 0.403 nm, and rings other than Debye-Scherrer rings of hcp zinc were observed.

Analytical electron microscopy of a sample which was prepared by the same process as that for the sample shown in FIG. 8(b) reveals that, after the deposition of zinc, the clusters on the supporting film contained approximately 15 at % of zinc. According to the table of lattice constants of gold solid solutions as a function of composition, the lattice constant of the alloy with this zinc concentration was evaluated to be 0.403 nm. This value is in agreement with the value obtained from the Debye-Scherrer rings in the selected-area electron diffraction pattern (SAED). These results indicate that the vapor-deposited zinc atoms have come in contact with gold clusters and have dissolved quickly into the clusters to form Au solid solution clusters (Au-15 at % Zn). FIGS. 8(c) and 8(c') show a bright field image (BFI) of the cluster after additional deposition of zinc for about 180 seconds and the corresponding SAED of the clusters, respectively. After this second deposition of zinc, the mean size of the clusters increased to about 7.5 nm in diameter. An enlargement of the SAED is shown in FIG. 9. As shown in FIG. 9, the Debye-Scherrer rings can consistently be indexed as those of disordered $\alpha_1$-Au$_3$Zn, which has the tetragonal structure with lattice constants of $\alpha_0$=0.402 nm and $c_0$=0.410 nm. These facts indicate that the solid solution clusters changed into disordered $\alpha_1$-Au$_3$Zn clusters with the second deposition of zinc. FIGS. 8(d) and 8(d') show a bright field image (BFI) of the clusters after additional deposition of zinc for about 180 seconds and the corresponding selected-area electron diffraction pattern (SAED), respectively. After this third deposition, the mean size of the clusters increased to approximately 8.0 nm in diameter. Analytical electron microscopy of the same sample shown in FIG. 8(d) reveals that the clusters on the supporting film contained, in total, 40 at % of Zn. An enlargement of the selected-area electron diffraction pattern (SAED) shown in FIG. 8(d') is shown in FIG. 10. The Debye-Scherrer rings in the SAED are divided into two parts. One part is the rings from disordered $\alpha_1$-Au$_3$Zn and the other part is the rings that can consistently be indexed a those of $\beta'$-AuZn which has the B2 structure with a lattice constant of 0.319 nm. These results indicate that a fraction of clusters of disordered $\alpha_1$-Au$_3$Zn changed into clusters of ordered $\beta'$-AuZn with this third deposition of zinc.

Upon the deposition of zinc, gold clusters quickly changed into Au-Zn solid solution clusters, disordered $\alpha_1$-Au$_3$Zn clusters, or ordered $\beta'$-AuZn clusters, depending upon the amount of the deposited Zn. These changes occur in less than 200 s (=180 s+20 s). Namely, as soon as zinc atoms are deposited and come in contact with gold clusters, Zn atoms quickly dissolve into the gold clusters and soon complete the whole course of alloying. Such spontaneous alloying which results in the formation of compound clusters was observed in the beginning of the study of the present invention.

A simple relationship $$x=(Dt)^{1/2}$$

can be used as a rough estimate for the diffusion coefficient. Here, t is the time needed to achieve appreciable diffusion of solute atoms over a distance x.

With x=3.25 nm (½ the average diameter of the gold clusters shown in FIG. 8(a)) and t=200 seconds, a diffusion coefficient of $5.3\times10^{-20}$ m$^2$ s$^{-1}$ was obtained. This value gives a guide for the lower limit of the diffusivity of zinc in gold clusters at room temperature, since the alloying takes place in less than 200 seconds. On the other hand, the diffusion coefficient of zinc in bulk gold $D_{Zn-Au}$=($8.4\times10^{-5}$)exp(−17400/T). Therefore, it can be said that the zinc diffusivity in gold clusters observed here is at least 10 orders of magnitude faster than that in bulk gold. A similar enhanced diffusivity of solute atoms in atom clusters has been observed for copper in gold clusters.

In order to see whether or not such rapid dissolution is ascribed to any temperature rise in the atom clusters, the temperature rise was estimated theoretically.

Model calculations were carried out on the temperature rise of nm-sized gold clusters that would be induced by (1) the electron beam heating, (2) the heat of condensation, and (3) the collision with zinc atoms with a kinetic energy of the order of KT. The calculated values for these three items were ~10, ~$10^3$ and ~$10^{-5}$K, respectively. The maximum temperature rise was 10K and was obtained for electron beam heating. This value of 10K is in agreement with that obtained from beam heating of lead clusters on a graphite substrate which is below 20K. Therefore, the rapid spontaneous alloying observed here does not originated from the temperature rise of the atom clusters.

Essentially, gold clusters undergo a translational motion, as entities, on the substrate. For example, Bassett has confirmed that some of the silver clusters of less than 20 nm in size can move rapidly from one point to another on a graphite substrate kept at 523K. If gold clusters prepared and used in the present experiment undergo a similar translational motion during the deposition of Zn, there arises a possibility that Zn atoms adhered to the surface of clusters are, in succession, incorporated into the interior of individual clusters as the clusters migrate as entities on the substrate. Such a process would bring about the rapid dissolution of zinc into the clusters. However, a preliminary experiment on this point, which was carried out using clusters in the gold-copper system, has revealed that positions of individual clusters on the supporting film have remained almost fixed during the deposition of copper onto gold clusters. Therefore, it is concluded that the spontaneous alloying observed here is not due to the translational motion of clusters.

According to Ajayan and Marks, gold clusters of less than 4 nm in diameter are in the quasimolten state at 300K. The gold clusters of 6.5 nm in diameter used in the present experiment are definitely not in the quasimolten state identified by Ajayan and Marks.

The mechanism behind the spontaneous alloying was studied recently. Quite recently, it was found that the occurrence of spontaneous alloying is significantly suppressed in clusters with a faceted shape as compared with those with a rounded shape of the same size. This fact shows that the morphology of the cluster surface plays an essential role in the spontaneous alloying.

As a conclusion, alloying behavior of zinc atoms into gold clusters has been studied by means of TEM. Upon the deposition of zinc, nm-sized gold clusters quickly change into disordered $\alpha_1$-Au$_3$Zn clusters or ordered $\beta'$-AuZn clusters depending on the amount of deposited zinc. The formation of compound clusters by spontaneous alloying has been discovered for the first time. The zinc diffusivity in the gold clusters estimated for the results is 10 orders of manitude faster than that in bulk gold. It is shown that the spontaneous alloying is not an artifact originating from the temperature rise of the atom clusters.

EXAMPLE 5

Formation AuSb$_2$ compound by spontaneous alloying:
(1) Test method

Preparation of gold clusters and subsequent antimony deposition onto the gold clusters were carried out with the use of a double-source evaporator which was set in the specimen chamber of an electron microscope. The evaporator consists of two spiral-shaped filaments made of tungsten. Amorphous carbon film was used as the supporting film, and was mounted on a molybdenum grid kept at room temperature. The distance between the supporting film (substrate) for the atom clusters and the filaments was approximately 100 mm. With the use of the evaporator, gold (antimony) clusters of nm size were produced on the supporting film. Antimony (gold) was then evaporated from the other filament onto the same supporting film. The fluxes of the deposited atoms were of the order of $10^{18}$ m$^2$.s$^{-1}$. Changes of the structure and morphology of the clusters produced by deposition of antimony (gold) atoms onto the clusters were monitored by taking bright field images and selected area electron diffraction patterns. The microscope used was equipped with a turbomolecular pumping system to achieve a base pressure of about $5\times10^5$ Pa in the specimen chamber and was operated at an accelerating voltage of 200 kV. The electron flux used was approximately $1.5\times10^{20}$ cm$^2$.s$^{-1}$. FIG. 11 shows a phase diagram for the Au-Sb alloy system.

(2) Test result
2)-1 Formation of AuSb$_2$ compound clusters by depositing antimony atoms onto gold clusters:

An example of AuSb$_2$ compound clusters produced by depositing antimony atoms onto gold clusters is shown in FIG. 12. FIGS. 12(a) and 12(a') show a bright field image of gold clusters formed on a supporting film and the corresponding electron diffraction pattern, respectively. The mean diameter of gold clusters is about 4 mm. The Debye-Scherrer rings in the electron diffraction pattern are consistently indexed as those of face centered cubic gold.

FIG. 12(b) and 12(b') show a bright field image of the gold clusters after antimony deposition for about 60 seconds and the corresponding electron diffraction pattern, respectively. These photographs were taken immediately after antimony deposition, that is, in less than about 20 seconds after the antimony atom deposition was turned off. With antimony deposition, the mean cluster diameter has been found to increase from about 4 nm to 7 nm. An enlargement of the electron diffraction pattern is shown in FIG. 13. As illustrated in FIG. 13 and as a result of observing the Debye-Scherrer rings, it was found that deposited antimony atoms have come in contact with gold clusters on the amorphous carbon film as the supporting substrate and have dissolved quickly into the interior of gold clusters to form clusters of the intermetallic compound AuSb$_2$. It should be noted that AuSb$_2$ having the bulk melting point of 733° K. can be easily formed by simply depositing gold atoms onto antimony clusters supported on a carbon substrate kept at room temperature.

(2)-2 Formation of AuSb$_2$ compound clusters by depositing gold atoms onto antimony clusters:

An example of AuSb$_2$ compound clusters produced by depositing gold atoms onto antimony clusters is shown in FIG. 14. FIGS. 14(a), (b) and 14(a'),(b') show a bright field image of antimony clusters formed on an amorphous carbon film and the corresponding electron diffraction pattern, respectively. The mean diameter of the antimony clusters is about 10 nm. The density of the antimony clusters is approximately $2\times10^{.}$ m$^2$ and is lower than that of gold clusters as seen from a comparison of FIG. 14(a) with FIG. 12(a).

The lower number density of antimony clusters is ascribed to a long mean free path of antimony atoms on the carbon substrate in comparison with that of gold atoms. (Mean free path is taken as the mean distance over which atoms migrate on the substrate before they aggregate to form clusters.) FIGS. 14(b) and 14(b') show a bright field image of Sb clusters after gold deposition for about 30 seconds and the corresponding electron diffraction pattern, respectively. The flux of gold atoms was also of the order of $10^{15}$ m$^{-2}$.s$^{-1}$.

These photographs were also taken immediately after gold deposition. As seen in FIG. 14(b), two distinct groups of clusters are formed by gold deposition: clusters with a mean diameter of about 4 nm and clusters with a mean diameter of about 13 nm. An enlargement of the electron diffraction pattern is shown in FIG. 15. The Debye-Scherrer rings in FIG. 15 were consistently indexed as those of AuSb$_2$ superimposed on those of face centered cubic gold. However, it is difficult to clearly indicate the Debye-Scherrer rings of face centered cubic gold. The reasons for this are as follows:

(1) Their intensity is weaker than that of the rings of AuSb$_2$.

(2) Rings (111), (002), (022) and (113) of face centered cubic gold and rings (220), (311), (421) and (432) of AuSb$_2$ almost overlap.

As shown in FIG. 14(b), according to a preliminary high resolution electron microscope (HREM) experiment of these clusters, it was revealed that the large clusters with a mean diameter of about 13 nm correspond to those of AuSb$_2$ whereas the small clusters with a mean diameter of about 4 nm correspond to those of face centered cubic gold. The formation of the small cubic gold clusters dispersed among the large AuSb$_2$ clusters is ascribed to the fact that the mean free path of gold atoms is shorter than that of antimony atoms.

From these observations, the fact is proved that, even at lower temperatures than room temperature, nm-sized antimony clusters can easily change into AuSb$_2$ clusters when an appropriate amount of gold is deposited onto the antimony clusters.

(3) Study of test result

In the present experiment, in order to examine the alloying behavior of antimony atoms into nm-sized gold clusters and that of gold atoms into nm-sized antimony clusters, a deposition experiment in a high-vacuum electron microscope was conducted at room temperature. Deposited gold (antimony) atoms quickly dissolve into antimony (gold) clusters and transform into clusters of the intermetallic compound AuSb$_2$. Of interest is that the AuSb$_2$ having a melting point of 733° K. can be produced by spontaneous alloying at room temperature.

It would be worthwhile to estimate the diffusivity of solute atoms in nm-sized atoms clusters from the result of the present experiment and to compare the value obtained with the corresponding bulk diffusivity. The diffusivity of antimony in gold clusters and bulk gold can roughly be estimated.

A simple relationship $$x=(Dt)^{1/2}$$

can be used for a rough estimate of the diffusion coefficient D. Where, t is the time needed to achieve appreciable diffusion of solute atoms over a distance x. With x=2 mm (half the mean diameter of gold clusters shown in FIG. 12(a)) and t=20 seconds, the value obtained for the diffusion coefficient D is $2 \times 10^{19}$ m$^2$.s$^{-1}$. This value is a lower limit for the diffusivity of antimony in nm-sized gold clusters at room temperature. The reason for this is because the alloying is actually completed in less than 20 seconds. The diffusion coefficient of antimony in bulk gold, $D_{BULK}$(m$^2$.s$^{-1}$) can be expressed as $$D_{BULK}=(1.14\times10^{-6})\exp(-15500/t)$$

Here, T is the temperature. Extrapolation of this relationship to room temperature (300K) gives a value of $4.2 \times 10^{-29}$ m$^2$.s$^{-1}$. Therefore, the antimony diffusivity in nm-sized gold clusters observed in the study of the present invention is at least 10 orders of magnitude faster than that in bulk gold. Similar enhanced diffusivity of solute atoms in atom clusters has been observed for copper atoms in gold clusters in the present inventors' study.

The temperature of nm-sized gold clusters would be increased by (1) electron beam heating, (2) heat of condensation, and (3) collision with antimony atoms with a kinetic energy of the order of KT. However, the temperature rises caused by these three effects are less than 10, less than $10^{-3}$ and less than $10^{-5}$, respectively. The maximum temperature rise is assumed to be less than 10K by electron beam heating. This indicates that the rapid spontaneous alloying and subsequent compound formation observed in the present study is not an artifact originating from the temperature rise of the atom clusters but an intrinsic property of the nm-sized clusters.

The mechanism behind such rapid spontaneous alloying is not clear yet. However, recent in situ depositing experiments conducted at low temperatures (100°–200° K.) on nm-sized clusters in the gold-copper system have led to the conclusion that the spontaneous alloying proceeds not by the conventional diffusion mechanism, which predicts alloying kinetics proportional to a square root ($t^{1/2}$), but by an abrupt reaction which occurs at once when solute atoms have come in contact with clusters.

Ajayan and Marks have pointed out that, for gold clusters in the size range of a few nm, the Gibbs free-energy surface as a function of the morphology of clusters is quite shallow. Therefore, condensation of antimony atoms on a gold cluster or of gold atoms on an antimony cluster excite the cluster from the original stable state into an unstable fluctuating state for a short period where the cluster repeats changes of various structures and shapes. During this period, the cluster changes into an alloyed cluster, and after the lapse of this short period, the alloyed cluster falls into its own final stable state. Such a structural fluctuation of short duration, if present, causes a one-time and abrupt reaction for the spontaneous alloying.

(4) Conclusion of Test

The alloying behavior of antimony atoms into nm-sized gold clusters and that of gold atoms into nm-sized antimony clusters have been studied through deposition experiments in a high-vacuum electron microscope. During the experiments, the clusters were supported on a carbon film (substrate) kept at room temperature. In both cases, deposited solute atoms quickly dissolved into clusters and transformed into clusters of the inter-metallic compound AuSb$_2$. This indicates that the intermetallic compound AuSb$_2$ having a bulk melting point of 733° K. can be easily produced by such spontaneous alloying even at room temperature.

Another embodiment of the present invention is shown as follows.

TABLE 2

| Example | Pure material A | Pure material B | Deposition method | Size of A (nm) | Deposition rate of B time | (l/m$^2$) area density | Degree of vacuum (Torr) | temperature (K.) | Substrate material | Compound to be formed |
|---|---|---|---|---|---|---|---|---|---|---|
| 6 | Au | Zn | vacuum deposition | 7 | 10$^{18}$/m$^2$s, 450s | 3 × 10$^{16}$ | 5 × 10$^{-7}$ | 300 | amorphous carbon | AuZn Au$_3$Zn |
| 7 | Au | Sb | vacuum deposition | 4 | 10$^{18}$/m$^2$s, 60s | 3 × 10$^{16}$ | 5 × 10$^{-7}$ | 300 | amorphous carbon | AuSb$_2$ |
| 8 | Sb | Au | vacuum deposition | 10 | 10$^{18}$/m$^2$s, | 2 × 10$^{15}$ | 5 × 10$^{-7}$ | 300 | amorphous carbon | AuSb$_2$ |
| 9 | In | Sb | vacuum deposition | 8 | 10$^{18}$/m$^2$s, 60s | 9 × 10$^{15}$ | 5 × 10$^{-7}$ 2 × 10$^{-10}$ | 300 160 | amorphous carbon | InSb |
| 10 | Sb | In | vacuum deposition | 10 | 10$^{18}$/m$^2$s, 60s | 2 × 10$^{15}$ | 5 × 10$^{-7}$ 5 × 10$^{-10}$ | 300 | amorphous carbon | InSb |
| 11 | Au | Pb | vacuum deposition | 4 | 10$^{17}$/m$^2$s, 60s | 3 × 10$^{16}$ | 7 × 10$^{-7}$ | 300 | amorphous carbon | Au$_2$Pb AuPb$_2$ AuPb$_3$ |
| 12 | Pb | Au | vacuum deposition | 7 | 10$^{17}$/m$^2$s, 60s | 3 × 10$^{16}$ | 5 × 10$^{-7}$ | 300 | amorphous carbon | AuPb$_2$ Au$_2$Pb |
| 13 | Cu | Sb | vacuum deposition | 5 | 10$^{18}$/m$^2$s, 120s | 3 × 10$^{16}$ | 5 × 10$^{-7}$ | 300 | amorphous carbon | Cu$_2$Sb |
| 14 | Sb | Cu | vacuum deposition | 10 | 10$^{18}$/m$^2$s, 120s | 1 × 10$^{15}$ | 5 × 10$^{-7}$ | 300 | amorphous carbon | Cu$_2$Sb |
| 15 | Al | Sb | vacuum deposition electron beam deposition | 5 | 10$^{18}$/m$^2$s, 60s 10$^{17}$/m$^2$s, 120s | 3 × 10$^{15}$ | 5 × 10$^{-7}$ 2 × 10$^{-7}$ 2 × 10$^{-10}$ | 300 | amorphous carbon | AlSb |
| 16 | Cu | Zn | vacuum deposition | 5 | 10$^{18}$/m$^2$s, 120s | 3 × 10$^{16}$ | 5 × 10$^{-7}$ | 300 | amorphous carbon | CuZn |

What is claimed is:

1. A method of manufacturing ultrafine particles of a compound consisting of at least two elements on the surface of a substrate comprised of at least one material selected from the group consisting of an organic material and an inorganic material, the method comprising:

(a) depositing a first element onto a surface of the substrate by a method selected from the group consisting of vacuum deposition, sputtering, chemical vapor deposition (CVD), and electron beam deposition, to provide a layer of particles of the first element, each of the particles having a particle size ranging from 2 to 50 nm, which particle size is effective to permit spontaneous alloying;

(b) depositing successively at least one additional element onto the layer of the first element on the surface of the substrate by a method selected from the group consisting of vacuum deposition, sputtering, chemical vapor deposition (CVD), and electron beam deposition, to provide respective layers of particles of the at least one additional element, each of the particles of the respective at least one additional element having a particle size ranging from 2 to 50 nm, which particle size is effective to permit spontaneous alloying, the successive depositions taking place at respective deposition rate ranges which are effective for forming a compound by spontaneously alloying the first element and the at least one additional element over a time period effective to provide a preselected area density; and (c) reacting the layers of particles on the substrate at a reaction temperature ranging from below 32° C. to −173° C., and under a vacuum ranging from 10$^{-11}$ to 10$^{-1}$ Torr to spontaneously alloy the first element and the at least one additional element.

2. The method according to claim 1, wherein the substrate is at least one organic material selected from the group consisting of polyacetylene, tetrathiofulvalene, phthalocyanine, anthracene, and polystyrene, and at least one inorganic compound selected from the group consisting of amorphous carbon, graphite, silicon oxide, silicon carbide, silicon nitride, boron nitride, magnesium oxide, silicon and germanium.

3. The method according to claim 1, wherein the substrate is at least one inorganic compound selected from the group consisting of amorphous carbon, graphite, silicon oxide, silicon carbide, silicon nitride, boron nitride, magnesium oxide, silicon, and germanium.

4. The method according to claim 1, wherein the first element and the at least one additional element are successively deposited at a deposition rate which is effective to form a compound by spontaneously alloying the first element and the at least one additional element, which deposition rate ranges from 10$^{10}$ to 10$^{20}$/m$^2$.s for a time period which ranges from 1 to 3000 seconds, and which deposition rate provides an area density ranging from 10$^{14}$ to 10$^{18}$ m$^{-2}$.

5. The method according to claim 1, wherein the compound consists of two elements and is a compound selected from the group consisting of AuZn, Au$_3$Zn, AuSb$_2$, SbAu, InSb, CdSe, GaAs, AlSb, ZnSe, CdS, SiNi, Si$_2$Ni, SiAl, AuPb$_2$, AuPb$_3$, Au$_2$Pb, Cu$_2$Sb, CuZn, and SiGe.

* * * * *